United States Patent
Frank et al.

(10) Patent No.: US 10,469,057 B1
(45) Date of Patent: Nov. 5, 2019

(54) METHOD FOR SELF ADAPTION OF GATE CURRENT CONTROLS BY CAPACITANCE MEASUREMENT OF A POWER TRANSISTOR

(71) Applicant: Infineon Technologies Austria AG, Villach (AT)

(72) Inventors: Wolfgang Frank, Augsburg (DE); Christian Philipp Sandow, Haar (DE)

(73) Assignee: Infineon Technologies Austria AG (AT)

( * ) Notice: Subject to any disclaimer, the term of this patent is extended or adjusted under 35 U.S.C. 154(b) by 0 days.

(21) Appl. No.: 16/152,652

(22) Filed: Oct. 5, 2018

(51) Int. Cl.
| | | |
|---|---|---|
| *H03K 3/00* | (2006.01) | |
| *H03K 5/12* | (2006.01) | |
| *H03K 3/012* | (2006.01) | |
| *G01R 19/165* | (2006.01) | |
| *G01R 19/12* | (2006.01) | |
| *H03K 17/04* | (2006.01) | |

(52) U.S. Cl.
CPC ............. *H03K 3/012* (2013.01); *G01R 19/12* (2013.01); *G01R 19/16519* (2013.01); *H03K 17/04* (2013.01)

(58) Field of Classification Search
CPC .. H03K 3/012; H03K 17/04; G01R 19/16519; G01R 19/12
USPC ........................................................ 327/170
See application file for complete search history.

(56) References Cited

U.S. PATENT DOCUMENTS

| | | | | |
|---|---|---|---|---|
| 6,172,541 | B1 * | 1/2001 | Young ............. | H03K 19/00361 327/170 |
| 7,148,697 | B2 * | 12/2006 | Doljack ............ | G01R 27/2605 324/548 |
| 9,634,656 | B2 * | 4/2017 | Inazu ................. | H03K 17/122 |
| 10,215,795 | B1 * | 2/2019 | Zannoth ............ | G01R 31/2621 |

* cited by examiner

*Primary Examiner* — Kenneth B Wells
(74) *Attorney, Agent, or Firm* — Design IP (57) ABSTRACT

A gate driver integrated circuit (IC) and a method of operating the same is provided. The gate driver IC is configured to drive a transistor between switching states in a power circuit, and includes a memory configured to store at least one measurement window parameter that defines a measurement interval; measurement circuitry configured to measure, over the measurement interval, a value corresponding to an operation of the power circuit, the measured value being proportional to an input capacitance of the transistor; processing circuitry configured to determine a correction factor based on the measured value, the correction factor being proportional to the input capacitance of the transistor; and a gate controller configured to control a gate current of the transistor based on the switching states and the correction factor.

23 Claims, 7 Drawing Sheets

METHOD FOR SELF ADAPTION OF GATE CURRENT CONTROLS BY CAPACITANCE MEASUREMENT OF A POWER TRANSISTOR

FIELD

The present disclosure relates generally to power transistors, and, more particularly, to controlling a gate current of a power transistor.

BACKGROUND

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state and a blocking state.

A power transistor is a power semiconductor device that may be used to drive a load current. There is a turn-on process and a turn-off process for switching the power transistor on and off. During the turn-on process, a gate driver integrated circuit (IC) is used to provide (source) a gate current to the gate of the power transistor in order to charge the gate. In contrast, during the turn-off process, the gate driver IC is used to draw (sink) a gate current from the gate of the power transistor in order to discharge the gate.

However, variations in turn-on time and turn-off time may vary across different power transistors. For example, gate oxide variations among power transistors may impact the input capacitance, the reverse (transfer) capacitance, and so on, of a power transistor which may result in variations in charging and discharging rates of the gate. Currently, there is no possibility to adapt the turn-on process or turn-off process to the individual characteristics of every power transistor. Therefore, an improved device having an ability to adapt the turn-on process or turn-off process to the individual characteristics of a power transistor may be desirable.

SUMMARY

Systems, devices, and methods are provided herein for adapting control of a gate current of a power transistor based on an input capacitance of the power transistor.

According to one or more embodiments, a gate driver integrated circuit (IC) is provided. The gate driver IC is configured to drive a transistor between switching states in a power circuit, and includes a memory configured to store at least one measurement window parameter that defines a measurement interval; measurement circuitry configured to measure, over the measurement interval, a value of the transistor over the measurement interval, where the measured value is proportional to an input capacitance of the transistor; processing circuitry configured to determine a correction factor based on the measured value, the correction factor being proportional to the input capacitance of the transistor; and a gate controller configured to control a gate current of the transistor based on the switching states and the correction factor. The measured value may correspond to a slope of a gate voltage of the transistor.

According to one or more embodiments, a method of driving a transistor between switching states is provided. The method includes storing at least one measurement window parameter that defines a measurement interval; measuring, over the measurement interval, a value corresponding to an operation of the power circuit, the measured value being proportional to an input capacitance of the transistor; determining a correction factor based on the measured value, the correction factor being proportional to the input capacitance of the transistor; and controlling a gate current of the transistor based on the switching states and the correction factor. The measured value may correspond to a slope of a gate voltage of the transistor.

BRIEF DESCRIPTION OF THE DRAWINGS

Embodiments are described herein making reference to the appended drawings.

DETAILED DESCRIPTION

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "front", "behind", "back", "leading", "trailing", "below", "above", etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

A signal processing circuit and/or a signal conditioning circuit may receive one or more signals (i.e., measurement signals) from one or more components in the form of raw measurement data and may derive, from the measurement signal further information. Signal conditioning, as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more components to a digital signal. The signal processing circuit may also include a digital signal processor (DSP) that performs some processing on the digital signal.

A "power semiconductor device" as used herein may be a semiconductor device on one or more chips with high voltage blocking and/or high current-carrying capabilities. In other words, such power semiconductor device may be intended for high current, typically in the Ampere range, e.g., up to several ten or hundred Ampere, and/or high voltages, typically above 15 V, and more typically 100 V and above.

Specific embodiments described in this specification pertain to, without being limited thereto, a power semiconductor device (e.g., a power transistor) that may be used within a power converter or a power supply. Thus, in one or more embodiments, the power semiconductor device may be configured to carry a load current that is to be fed to a load and/or, respectively, that is provided by a power source.

Power transistors suitably connected to form half-bridges are commonly used in the field of power electronics. For example, half-bridges may be used for driving electric motors or switched mode power supplies. Power transistors may include Insulated Gate Bipolar Transistors (IGBTs) and Metal Oxide Semiconductor Field Effect Transistors (MOSFETs) (e.g., Si MOSFETs or SiC MOSFETs).

While IGBTs are used as an example in the embodiments described below, it will be appreciated that MOSFETs may be substituted for the IGBTs. In this context, when substituting a MOSFET for an IGBT, a MOSFET's drain may be substituted for an IGBT's collector, the MOSFET's source may be substituted for the IGBT's emitter, the MOSFETs drain-source voltage Vds may be substituted for the IGBT's collector-emitter voltage Vce, and so on, in any one of the examples described herein. Thus, any IGBT transistor may be substituted by a MOSFET transistor and vice versa. In fact, any MOS gated transistor may be used.

Figure 1A:
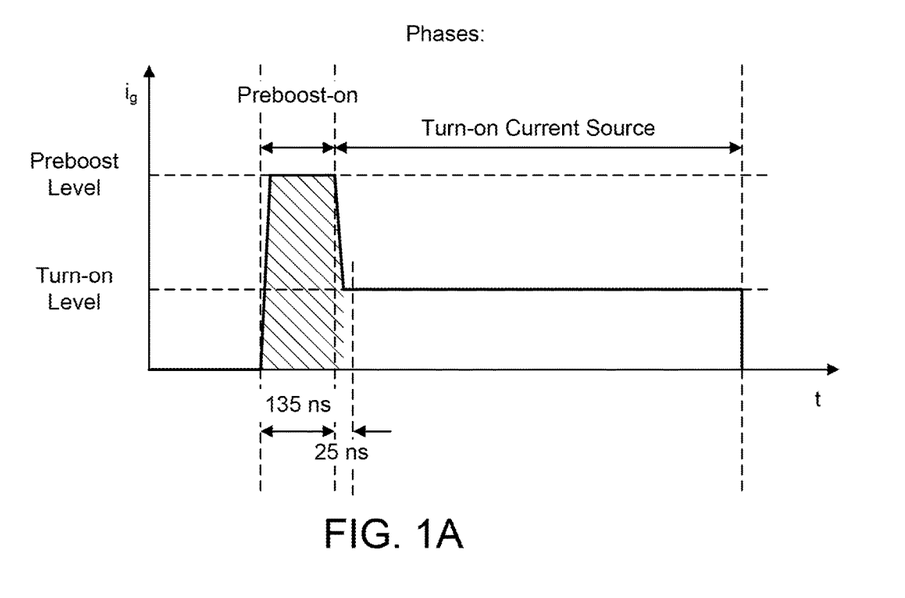
FIGS. 1A and 1B show graphs illustrating schemes for slew rate control (SRC) of a power transistor during turn-on and turn off, respectively, according to one or more embodiments.
Figure 1B:
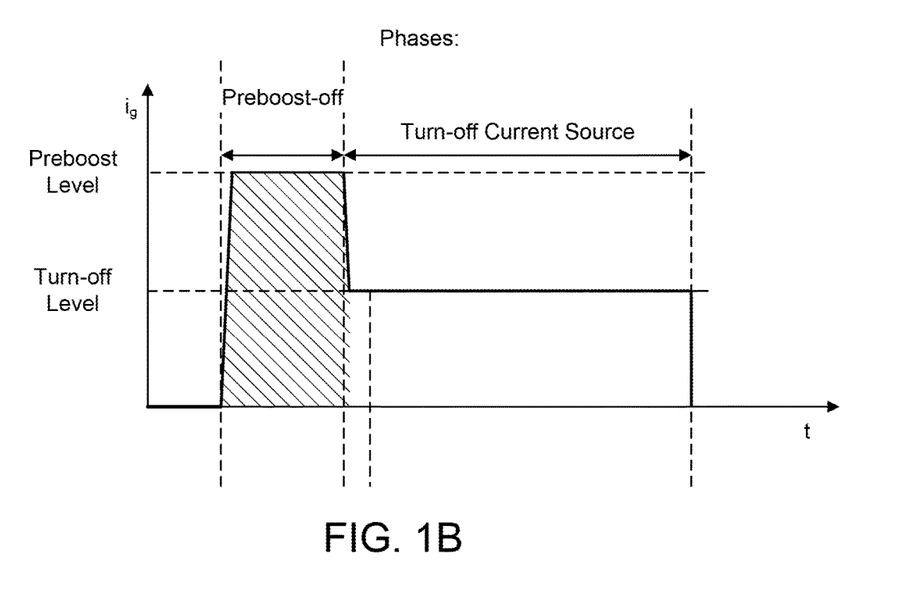

FIGS. 1A and 1B show graphs illustrating a scheme for slew rate control (SRC) of a power transistor during turn-on and turn off, respectively, according to one or more embodiments. In particular, each graph shows a gate current that flows to the power transistor through a source FET of a gate driver IC (e.g., during turn-on) or a gate current that flows from the power transistor through a sink FET of the gate driver IC (i.e., during turn-off).

For example, for the turn-on process shown in FIG. 1A, the gate driver IC uses a feedback control loop to control the gate current (e.g., to maintain a constant gate current during turn-on). This helps to control a particular dv/dt, di/dt, or both. The slew rate control technique shown in FIG. 1A is divided into two main intervals: a preboost-on interval and a turn-on interval. A different constant current is maintained for each interval. Similarly, in FIG. 1B, the slew rate control technique uses a preboost-off interval and a turn-off interval. The preboost-on interval and the preboost-off interval may generally be referred to as preboost intervals, whereas the turn-on interval and the turn-off interval may generally be referred to as switching state intervals.

The preboost-on current loads the gate terminal of a power transistor so that the gate voltage is close, but still below the gate threshold voltage needed to turn on the transistor. This is realized by applying a gate current amplitude (i.e., a preboost level) for the preboost-on interval. Thus, the gate terminal is precharged to a pre-turn-on voltage.

The turn-on current level is applied during the second interval (i.e., the turn-on interval). The amplitude of the turn-on current is often lower than the preboost-on current amplitude but is sufficient to turn on the transistor and keep the transistor turned on.

A similar principle is followed for the turn-off process. In particular, a preboost-off current discharges the gate terminal so that the gate voltage is close, but still above the gate threshold voltage so that the transistor is still on. Subsequently, the turn-off current level is applied during the turn-off interval in order to turn off the transistor.

The turn-off process of power transistors is often dominated by a longer turn-off propagation delay time. The propagation delay is dominating the dimensioning of the dead time in half-bridge configurations. Since no energy is transferred to the load of power electronic converters, it is a target to reduce the dead time as much as possible.

An individual and automated fine adjustment of the turn-off and the turn-on process is desired in order to achieve the optimal performance of the power transistor. As will be shown, this can be achieved by a measurement of the individual input capacitance of the power transistor. Once the input capacitance is known, precise turn-on and turn-off times and behavior can be controlled. This would allow all power transistors in a power device to be regulated to have the same turn-on and turn-off behavior despite having different characteristics, such as different input capacitances that result from different gate oxide thicknesses.

In general, Ciss is the input capacitance, and is the capacitance obtained by totaling the gate-emitter capacitance $C_{GE}$ and the gate-collector capacitance $C_{GC}$. The gate-emitter capacitance $C_{GE}$ and gate-collector capacitance $C_{GC}$ are determined by the capacitance of the gate oxide film. Thus, the input capacitance Ciss is the capacitance of the IGBT as a whole, as seen from the input. This capacitance must be driven (charged) in order to cause the IGBT to operate, and so it is a parameter of importance when studying the drivability of an input device or input losses. Qg is the amount of charge necessary to drive (charge) Ciss.

Figure 2A:
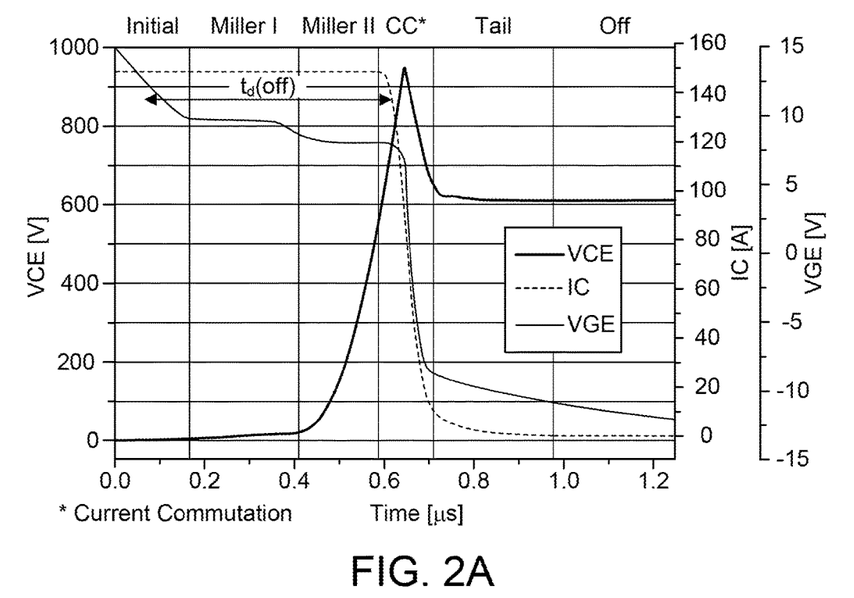
FIGS. 2A and 2B show graphs that illustrate a turn-off process of an IGBT according to one or more embodiments.
Figure 2B:
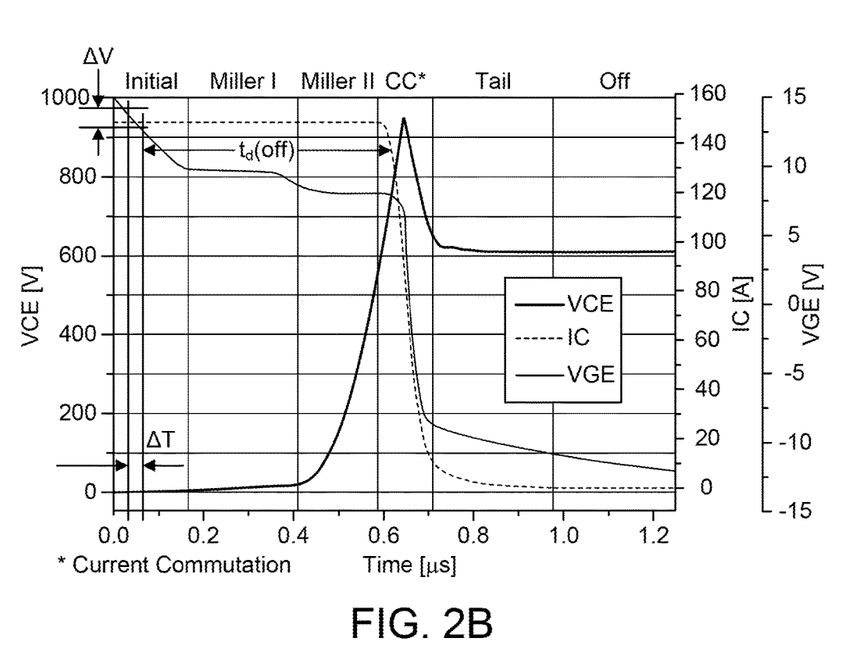

FIGS. 2A and 2B show graphs that illustrate a turn-off process of an IGBT according to one or more embodiments. In particular, FIGS. 2A and 2B show waveforms for the collector-emitter voltage $V_{CE}$, the gate-emitter voltage $V_{GE}$, and the collector current $I_C$ for the turn-off of a 1200V trench IGBT and turn-off delay, td(off). The gate-emitter voltage $V_{GE}$ may generally be referred to herein as the gate voltage. Furthermore, while a 1200V trench IGBT may be used in one or more examples, it will be appreciated that other transistor types with other voltage ratings may be used without departing from the scope of this disclosure.

The turn-off delay, td(off), is the time taken to discharge the input capacitance Ciss after the transistor is switched off. By definition, td(off) starts at 90% VGE (e.g., 13.5V) and continues until 90% of the collector current IC.

Similarly, a turn-on delay, td(on), is the time taken to charge the input capacitance of the device before drain current conduction can start. By definition, td(on) starts at 10% $V_{GE}$ (e.g., 1.5V) and continues until 10% of the collector current $I_C$.

Turning back to FIGS. 2A and 2B, the turn-off process of an IGBT can be divided in several phases during which the effective input capacitance is dynamically changing. These phases include an initial phase, a first Miller phase (Miller I), a second Miller phase (Miller II), a current commutation phase, a tail phase, and an off phase. The initial phase starts from an initial switching of the transistor to a first Miller voltage, which defines the start of Miller I.

The turn-off delay of the IGBT is a main contributor to the turn-off propagation delay and, as noted above, is measured between 0.9*$V_{GE}$(on) and 0.9*$I_C$(on).

The main contributors to td(off) are the two Miller phases I and II whose lengths depend on the charging time of Ciss. Therefore, the input capacitance can be measured to adjust the charging/discharging current in a way that the charging/discharging time becomes independent of Ciss variations. Here, the measurement of Ciss is performed in the initial phase of the switching, because due to the presence of the MOS-Channel in this state, for most modern IGBTs, $C_{GE}$=Ciss. Thus, the initial phase during turn-off reflects the input capacitance of the power transistor.

As shown in FIG. 2A, at switch-off, the gate voltage $V_{GE}$ is initially discharged to the first Miller voltage in the initial phase. Following the initial phase, the transistor undergoes a transient operation where $V_{CE}$ ramps up and the collector current $I_C$ ramps down. Turn-off is achieved by extracting gate charges via the sink transistor (i.e., the discharging FET) of the gate driver IC. The initial phase is the period between initiating a switching off of the transistor and the first Miller phase (e.g., the first Miller voltage at $V_{GE}$).

As can be seen, the gate voltage $V_{GE}$ exhibits a constant slope during the initial phase. This slope is a function of the input capacitance Ciss. Thus, the slope of the gate voltage $V_{GE}$ in the initial phase can be used to determine the input capacitance Ciss and/or determine a correction factor that is proportional to the input capacitance Ciss. The determined input capacitance Ciss or correction factor is used to adjust the preboost-on current or the preboost-off current in either amplitude and/or duration. Alternatively or additionally, an additional preboost current can be injected prior to the primary preboost current. Alternatively or additionally, the amplitude of the turn-on current or the turn-off current may also be adjusted for the corresponding turn-on or turn-off process.

To measure $C_{GE}$ ($C_{GE}$=Ciss), the slope (i.e., slew rate) of $V_{GE}$ during the initial phase is measured. Since the starting time of the gate discharge is known in the gate driver IC (i.e., based on switching on the corresponding sink FET), there are several options to measure the slope of $V_{GE}$ during a turn-off process of the transistor. These options include, but are not limited to, integrating $I_G$ over a pre-defined time-delay $\Delta T$ shorter than the initial phase; measuring $V_{GE}$ (e.g., a gate voltage change) after a pre-defined time-delay $\Delta T$ shorter than the initial phase; or measuring the time-delay until a pre-defined $V_{GE}$ is reached. FIG. 2B shows possible measurement intervals or windows in the initial phase for $\Delta V$ and $\Delta T$. These measurement intervals may be preset or preconfigured as pre-settings in the gate driver IC to measure the slope of $V_{GE}$.

Alternatively, other measurements in the power circuit can be made to determine the input capacitance as long as those measurements are proportional to the input capacitance. For example, dI/dt relating to a change in inductor current could be measured during the initial phase instead of the slew rate of the gate voltage $V_{GE}$. Here, the inductor is provided in a power converter circuit (e.g., boost converter) in which the transistor is used regulate the load current. Thus, measurement circuitry may be configured to measure, over a measurement interval, a value corresponding to an operation of the power circuit, the measured value being proportional to an input capacitance of the transistor.

Similarly, since the starting time of the gate charging is known in the gate driver IC (i.e., based on switching on the corresponding source FET), the same techniques may be used to measure the slope of $V_{GE}$ during a turn-on process of the transistor.

To facilitate a higher accuracy of the Ciss measurement, a third phase with reduced gate driver current for measuring Ciss can optionally be introduced preferably before the pre-boost phase.

Once the slope of $V_{GE}$ is determined, a correction factor that is proportional to the input capacitance Ciss can be derived from this determined slope. That is, the correction factor may be representative of the input capacitance Ciss of the power transistor. Alternatively, the input capacitance Ciss may be estimated directly from the slope of $V_{GE}$ and used as the correction factor. Alternatively, the slope may be compared to a slope reference value and a deviation factor may be derived from the comparison. The deviation factor may be a positive or negative value and may be used as the correction factor. Alternatively, the input capacitance Ciss may be mapped via a look-up table to a corresponding correction factor such that the input capacitance Ciss may be determined from the slope of $V_{GE}$ and a corresponding correction factor may be determined from the look-up table. The determined correction factor may be stored in the gate driver IC for a correction of the turn-on process, but also for the turn-off process.

Once the correction factor is determined, this value may be used to adjust the turn-off delay time td(off) and/or the turn-on delay time td(on). There are several options that may be used to adjust these delay times based on the correction factor, including, but not limited to: adjust the preboost amplitude (i.e., adjust the preboost-on level and/or the preboost-off level); adjust the amplitude of the gate turn-off current and/or the amplitude of the gate turn-on current that is proportional by an externally controllable factor to the measured Ciss; and/or adjust the length of either (or both) pre-boost phase to supply a gate charge that is proportional by an externally controllable factor to the measured Ciss.

Thus, in FIG. 2A, the measured slope of $V_{GE}$ is used to control the delay between the switching signal initiated by the gate driver IC and the end of the first Miller phase to a constant delay time, thereby compensating system-to-system variations. Moreover, the correction factor that is determined during turn-off may be stored in memory of the gate driver IC and may be used to modify the turn-on delay time in an analog way, or vice versa.

Figure 3:
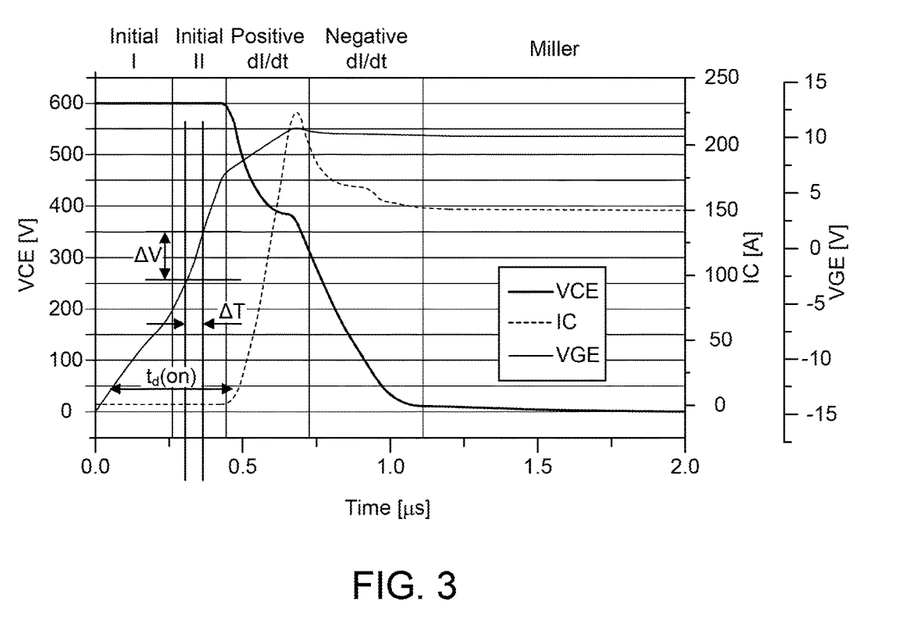
FIG. 3 shows a graph that illustrates a turn-on process of an IGBT according to one or more embodiments.

For example, FIG. 3 shows a graph that illustrates a turn-on process of an IGBT according to one or more embodiments. In particular, FIG. 3 shows waveforms for the collector-emitter voltage $V_{CE}$, the gate-emitter voltage $V_{GE}$, and the collector current $I_C$ for the turn-on of a 1200V trench IGBT and turn-on delay, td(on). As noted above, the turn-on delay, td(on), is the time taken to charge the input capacitance of the device before drain current conduction can start. By definition, td(on) starts at 10% $V_{GE}$ (e.g., 1.5V) and continues until 10% of the collector current $I_C$.

The turn-on process of an IGBT can be divided in several phases during which the effective input capacitance is dynamically changing. These phases include a first initial phase (Initial I), a second initial phase (Initial II), a positive dI/dt phase, a negative dI/dt phase, and a Miller phase. The slope of the gate voltage is measured in the first initial phase (Initial I) or in the second initial phase (Initial II) during which a constant slope of $V_{GE}$ is a function of the input capacitance Ciss. FIG. 3 further shows possible measurement windows ΔV and ΔT used to measure the slope of the gate voltage in the second initial phase (Initial II).

It will be appreciated that similar principles can be applied for determining the slope of $V_{GE}$ based on either the turn-off process shown in FIGS. 2A and 2B or the turn-on process shown in FIG. 3. Once the slope of $V_{GE}$ is determined in either process, a correction factor may be derived that can be used to adjust one or both of the turn-on delay time, td(on), and the turn-off delay time, td(off). For example, there are several options that may be used to adjust these delay times based on the correction factor, including, but not limited to: adjust the preboost amplitude (i.e., adjust the preboost-on level and/or the preboost-off level); adjust the amplitude of the gate turn-off current and/or the amplitude of the gate turn-on current that is proportional by an externally controllable factor to the measured Ciss; and/or adjust the length of either (or both) pre-boost phase to supply a gate charge that is proportional by an externally controllable factor to the measured Ciss.

Figure 4:
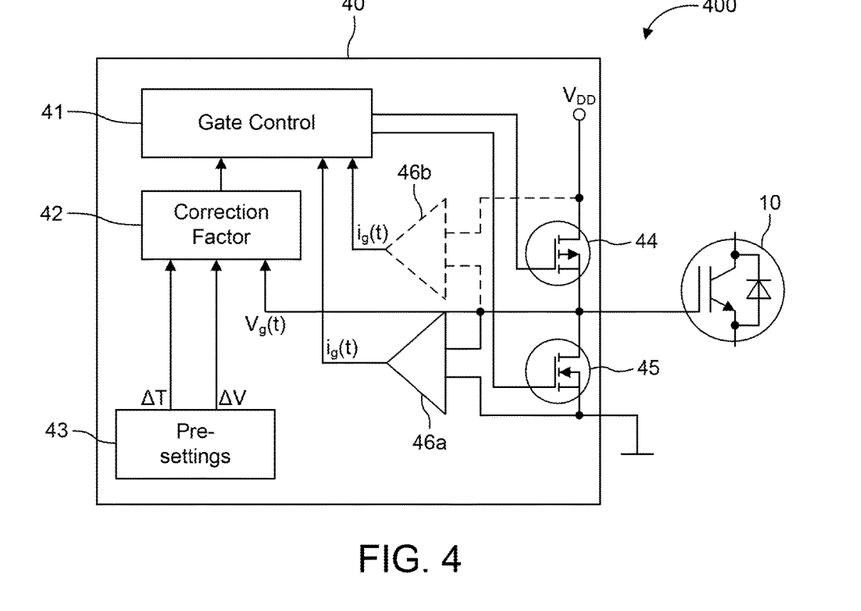
FIG. 4 shows a schematic block diagram illustrating a gate current control circuit configured to control a power transistor according to one or more embodiments.

FIG. 4 shows a schematic block diagram illustrating a gate current control circuit 400 configured to control a power transistor 10 according to one or more embodiments. The gate current control circuit 400 includes a gate driver IC 40 that is configured to control the gate current of the power transistor 10. The gate driver IC 40 includes a gate control unit 41, a correction factor unit 42, a memory unit 43, a source FET 44, a sink FET 45, and a comparator circuit that includes at least one comparator (e.g., op-amp comparator) 46a and 46b.

Only one or both comparators 46a and 46b may be present in the gate driver IC 40 depending on whether the correction factor is derived during the turn-off process and/or the turn-on process of the power transistor 10. Since one correction factor may be used for adjusting both the turn-on delay time and the turn-off delay time, both comparators 46a and 46b may not be included. Thus, as shown in FIG. 4, comparator 46b is optional or represents an alternative embodiment in which it would be used instead of comparator 46a.

Each of the embodiments described herein utilize a feedback controlled gate current control, which does not use gate resistors for the gate control of the power transistor or only small resistance values. Thus, the gate driver IC 40 includes the gate control unit 41 that includes a controller that receives gate current feedback information $i_g(t)$ from comparator 46a and additionally or alternatively from comparator 46b and a correction factor from the correction factor unit 42, and determines/generates a source control signal for controlling the on/off state of the source FET and a sink control signal for controlling the on/off state of the sink FET based on the received gate current feedback information $i_g(t)$ and correction factor.

Specifically, the gate control unit 41 controls a current that flows through each of the source FET 44 and the sink FET 45. It is responsible for setting the amplitudes for the preboost-on and off currents, the turn-on current, and the turn-off current, as well as the durations thereof. Thus, the controller may include processing circuitry that is configured to receive one or more inputs and to generate gate control signals for the FETs 44 and 45 based thereon.

Here, the gate current feedback information $i_g(t)$ is used by the gate control unit 41 to set and maintain a constant gate current of the power transistor 10. It represents the current through the sink FET 45 calculated by $V_{dsFET}/R_{dson}$. If comparator 46b is provided instead of comparator 46a, $i_g(t)$ would represent the current through the source FET 46 calculated by $V_{dsFET}/R_{dson}$. Thus, the comparators 46a and 46b measure the voltage Vds across its respective FET (i.e., FET 45 and FET 44, respectively) and output the voltage measurement (i.e., a voltage difference) to the gate control unit 41. For example, since the voltage Vds is representative of the gate current, the gate control unit 41 may use the voltage Vds of the sink FET 45 as the gate current feedback information $i_g(t)$ or may calculate the gate current feedback information $i_g(t)$ based on a known $R_{dson}$ of the sink FET 45. Similarly, the gate control unit 41 may use the voltage Vds of the sink FET 44 as the gate current feedback information $i_g(t)$ or may calculate the gate current feedback information $i_g(t)$ based on a known $R_{dson}$ of the sink FET 44.

Memory unit 43 is a storage device configured to store one or more pre-settings, such as ΔV and ΔT, that may be used to determine a slope of $V_{GE}$ of the power transistor 10. For example, as noted above, there are several options to measure the slope of $V_{GE}$. These methods include, but are not limited to, integrating $I_G$ over a pre-defined time-delay $\Delta T$ shorter than the corresponding initial phase; measuring $V_{GE}$ (e.g., a gate voltage change) after a pre-defined time-delay $\Delta T$ shorter than the corresponding initial phase; or measuring the time-delay until a pre-defined $V_{GE}$ is reached.

Here, $\Delta V$ and $\Delta T$ define measurement intervals that are preconfigured as pre-settings in the gate driver IC 40 to measure the slope of $V_{GE}$. Specifically, $\Delta V$ defines a measurement window of a voltage range starting at a given point inside initial phase of FIGS. 2A and 2B without intersecting into Miller I. This preset value is used for determining the correction factor as an input for the gate current control. Similarly, $\Delta T$ defines a measurement window interval over time for the change of gate voltage within the initial phase.

Thus, both $\Delta V$ and $\Delta T$ are preset to a defined range in the corresponding initial phase that defines a measurement range used for determining the slope of $V_{GE}$ of the power transistor 10 during a turn-off process (i.e., during the initial phase). The correction factor unit 42 is configured to receive the pre-settings $\Delta V$ and $\Delta T$ from the memory unit 43 for determining a correction factor based on a gate voltage measurement $v_g(t)$ of the power transistor 10.

The correction factor unit 42 includes processing circuitry configured to receive the gate voltage measurement $v_g(t)$ and determine the slope of $V_{GE}$ using one or both of the measurement windows $\Delta V$ and $\Delta T$. The correction factor unit 42 is coupled to the gate of the power transistor 10 and is configured to measure the gate voltage $v_g(t)$ over time (e.g., according to one or both of the measurement windows $\Delta V$ and $\Delta T$). At times, such as in FIG. 4, gate voltage measurement $v_g(t)$ and $V_{GE}$ may be the same. In other embodiments, gate voltage measurement $v_g(t)$ may be representative of $V_{GE}$ where $v_g(t)$ is proportional to $V_{GE}$.

The correction factor unit 42 may measure the gate voltage $V_{GE}$ at the start of measurement window $\Delta T$ and at an end of the measurement window $\Delta T$, and determine the slope of $V_{GE}$ based on the gate voltage measurements.

Alternatively, the correction factor unit 42 may measure a time instance when the gate voltage $V_{GE}$ reaches an initial value defined by measurement window $\Delta V$ and another time instance when the gate voltage $V_{GE}$ reaches a final value defined by measurement window $\Delta V$, and determine the slope of $V_{GE}$ based on the time measurements.

Other methods for determining the slope of $V_{GE}$ may also be used. For example, measuring $V_{GE}$ after a pre-defined time-delay $\Delta T$ shorter than the corresponding initial phase, or measuring the time-delay until a pre-defined $V_{GE}$ is reached.

To measure the slope of $V_{GE}$, the correction factor unit 42 may use digital signal processing and/or analog signal processing. For example, according to FIG. 2B, the measurement of the gate voltage change $\Delta V$ during a fixed interval of $\Delta T=30$ ns after the first gate voltage decay may be implemented.

For digital signal processing implementing digital control, the correction factor unit 42 may include using an ADC to record digital voltage values of $V_{GE}$ into a register. The correction factor unit 42 may then use a DSP or other digital processor to compare the digital values of the gate voltage measurement $v_g(t)$ to one or both measurement windows $\Delta V$ and $\Delta T$. Based on the comparison, the slope of $V_{GE}$ can be derived.

Alternatively, for analog signal processing implementing analog control, the correction factor unit 42 may include appropriate analog circuitry (e.g., an opamp) used to compare analog values of the gate voltage measurement $v_g(t)$ to one or both measurement windows $\Delta V$ and $\Delta T$. Based on the comparison, the slope of $V_{GE}$ can be derived.

Once the correction factor unit 42 determines the slope of $V_{GE}$, the correction factor unit 42 may determine a correction factor that is proportional to the input capacitance Ciss. The correction factor unit 42 may then transmit the correction factor to the gate control unit 41 which is configured to use the correction factor to adjust the amplitudes of the preboost-on current and the turn-on current by adjusting the gate control signals output to the FETs 44 and 45. Similarly, the correction factor may also be used by the gate control unit 41 to adjust the amplitudes of the preboost-off current and the turn-off current. The gate control unit 41 may also, or in the alternative, adjust the pulse length of the preboost currents.

The gate control unit 41 includes a controller that receives gate current feedback information $i_g(t)$ from comparator 46a and additionally or alternatively from comparator 46b and a correction factor from the correction factor unit 42, and, based on these inputs, generates a source control signal for controlling the on/off state of the source FET and a sink control signal for controlling the on/off state of the sink FET, as well as for controlling the amplitude of the source and sink currents flowing therethrough. As explained above, the source and sink currents correspond to the preboost currents and the turn-on and turn-off currents.

In sum, the input capacitance Ciss of the power transistor 10 may be derived out of the gate voltage curve $v_g(t)$ during turn-off and a correction factor for the amplitudes of the preboost-on current and the turn-on current may be calculated therefrom. The relationship between the current amplitudes and the input capacitance Ciss is linear.

The correction factor unit 42 may also be used to monitor the lifetime of the transistor 10. For example, the input capacitance of a transistor may increase over its lifetime until the transistor eventually fails. Thus, measurement values, such as the slope of slope of $V_{GE}$, proportional to the input capacitance or a calculated input capacitance itself may be used to predict and monitor a lifetime of the transistor 10. A threshold set prior to failure limit may be used to provide sufficient warning to a user that the transistor 10 is approaching the end of its lifetime and should be replaced.

In one example, the correction factor unit 42 may determine a slope of $V_{GE}$ (or other measured values related thereto) proportional to the input capacitance, and the correction factor unit 42 may compare the determined slope of $V_{GE}$ to a lifetime predictor threshold. On the condition that the determined slope of $V_{GE}$ exceeds the lifetime predictor threshold, the correction factor unit 42 may generate a feedback signal to warn a user that the transistor 10 is approaching the end of its lifetime and should be replaced. The feedback signal may be used, for example, to generate a sound or visual indicator to the user. Other measured values used to derive the slope of $V_{GE}$ may also be used and compared to a corresponding lifetime predictor threshold.

In the embodiment shown in FIG. 4, the gate driver IC 40 discharges the gate of the power transistor 10 using constant current and determines how fast voltage at the gate drops. The constant current is controlled by the gate control unit 41. The correction factor unit 42 measures the voltage $v_g(t)$ of the integrated sink FET 45 inside the gate driver IC 40. The voltage $v_g(t)$ is proportional to the current through the FET 45. This may also automatically lead to a correction of the individual FET resistance of the sink FET 45 in case of production or temperature drift. This measurement can be performed as an initial calibration action or as a pulse-by-pulse action.

The correction factor unit 42 uses the measurement result (e.g., the slope of $V_{GE}$) to compare it to a reference value, and a deviation factor is derived from the comparison. The deviation factor can be stored in the IC 40 as a correction factor for a correction of the turn-on process, but also for the turn-off process. It is also possible to measure the voltage drop of the source FET 44 during turn-on in a similar manner to derive the correction factor.

Figure 5:
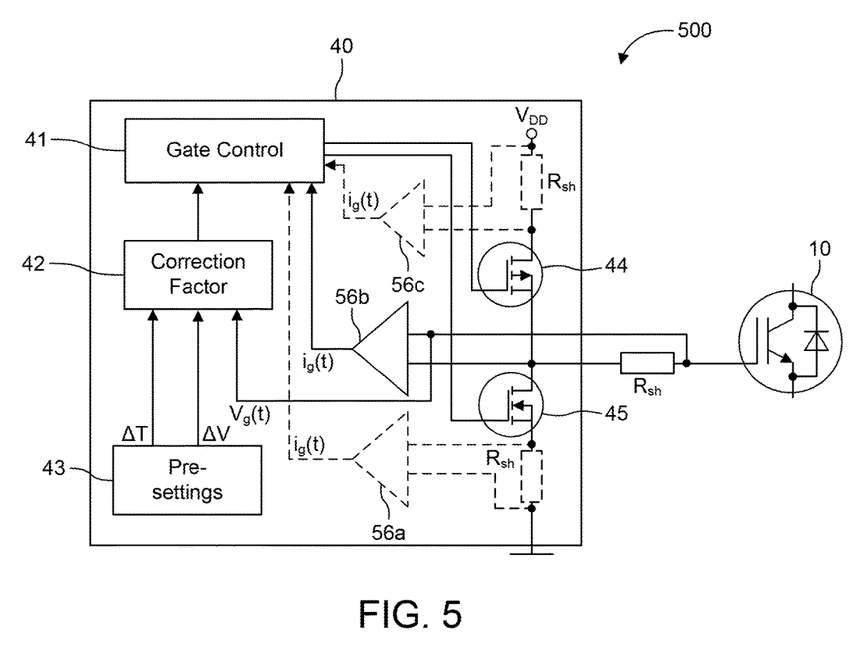
FIG. 5 shows a schematic block diagram illustrating another gate current control circuit configured to control a power transistor according to one or more embodiments.

FIG. 5 shows a schematic block diagram illustrating a gate current control circuit 500 configured to control a power transistor 10 according to one or more embodiments. The gate current control circuit 500 is similar to the gate current control circuit 400 provided in FIG. 4, except a shunt resistor $R_{sh}$ may be used to derive the gate current feedback information $i_g(t)$. That is, instead of measuring the voltage drop across one of the FETs 44 or 45, as in FIG. 4, a voltage drop across a shunt resistor $R_{sh}$ of known resistance may be measured by a comparator circuit that includes at least one comparator (e.g., op-amp comparator) 56a, 56b, and 56c. A gate resistor may be used as a shunt resistor as well. The feedback information could also be a voltage drop across an inductance.

Thus, a dedicated shunt resistor $R_{sh}$ is used for a precise measurement of the gate current for feedback control. The shunt resistor $R_{sh}$ may be connected between the gate driver IC 40 and the power transistor 10 similar to a gate resistor. An additional sense connection is used, which could be the same connection as it is used for the active miller clamping. The combination of the measurement interval (e.g., $\Delta V$ or $\Delta T$), the gate current $i_g(t)$, and the gate voltage $v_g(t)$ leads to a determination of a quantity that is representative of the power transistor's input capacitance Ciss. This quantity may be any metric that can be used to derive a correction factor. The shunt resistor $R_{sh}$ should to be low-resistive enough in order not to limit the gate current. The shunt resistor $R_{sh}$ may be integrated in the gate driver IC 40, but may also be external thereto.

Figure 6:
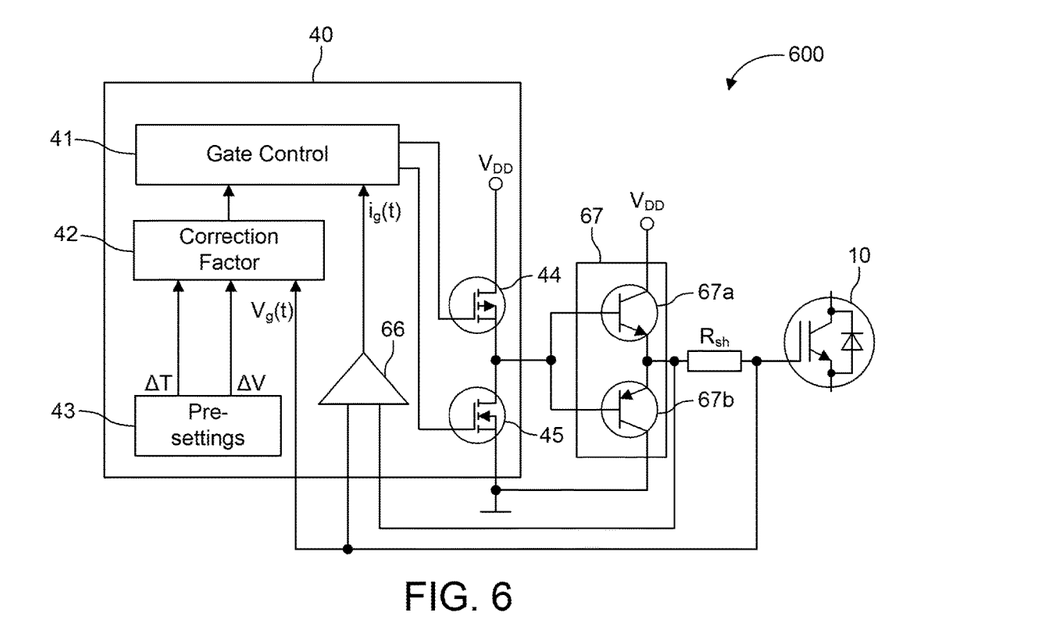
FIG. 6 shows a schematic block diagram illustrating another gate current control circuit configured to control a power transistor according to one or more embodiments.

FIG. 6 shows a schematic block diagram illustrating a gate current control circuit 600 configured to control a power transistor 10 according to one or more embodiments. The gate current control circuit 600 is similar to the gate current control circuit 500 provided in FIG. 5, except the circuit 600 includes an external booster circuit 67 that includes complementary bipolar transistors 67a and 67b. The booster circuit 67 is an amplifier circuit used to increase the gate current that is generated by the gate driver IC 40. A shunt resistor $R_{sh}$ is connected between the power transistor 10 and the booster circuit 67, and is used by comparator circuitry 66 to generate the gate current feedback information $i_g(t)$. Here, both terminals of the shunt resistor $R_{sh}$ are used by the comparator circuitry 66 to measure the voltage drop of the shunt resistor $R_{sh}$.

Figure 7:
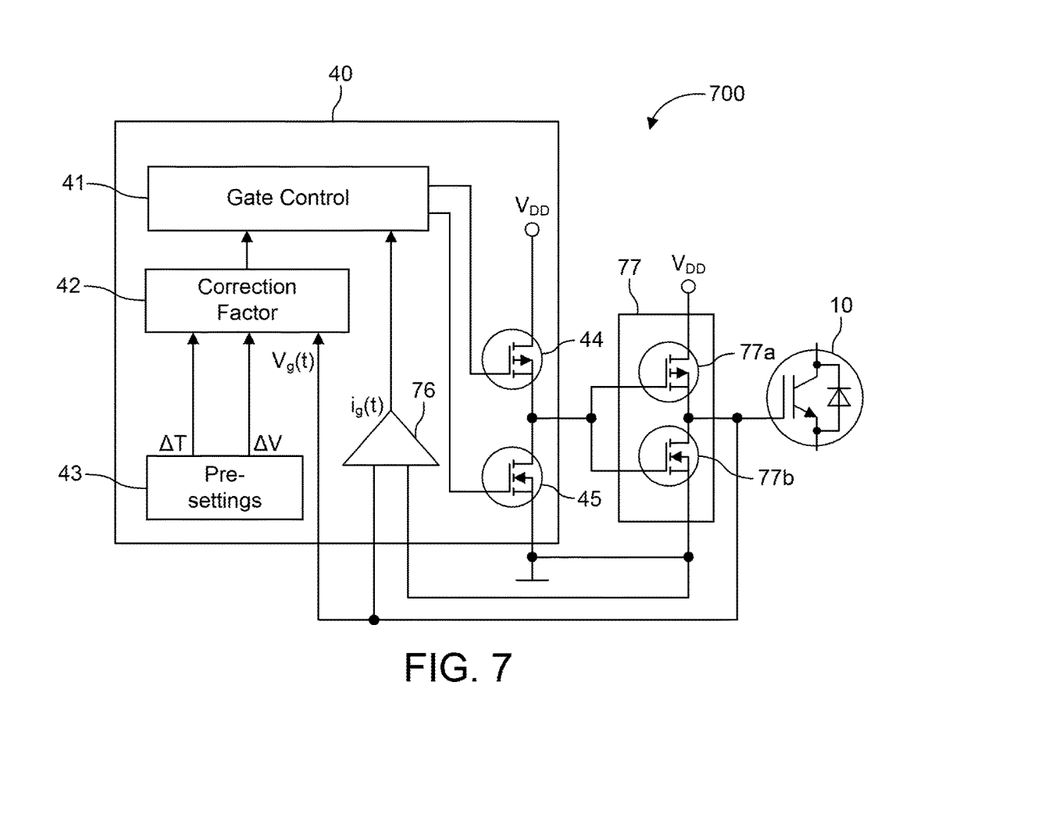
FIG. 7 shows a schematic block diagram illustrating another gate current control circuit configured to control a power transistor according to one or more embodiments.

FIG. 7 shows a schematic block diagram illustrating a gate current control circuit 700 configured to control a power transistor 10 according to one or more embodiments. The gate current control circuit 700 is similar to the gate current control circuit 600 provided in FIG. 6, except the circuit 700 includes an external booster circuit 77 that includes complementary MOSFET transistors 77a and 77b. In addition, comparator circuitry 76 is configured to measure the voltage drop across the MOSFET 77b for generating the gate current feedback information $i_g(t)$. Thus, a shunt resistor may not be used in this implementation.

Figure 8:
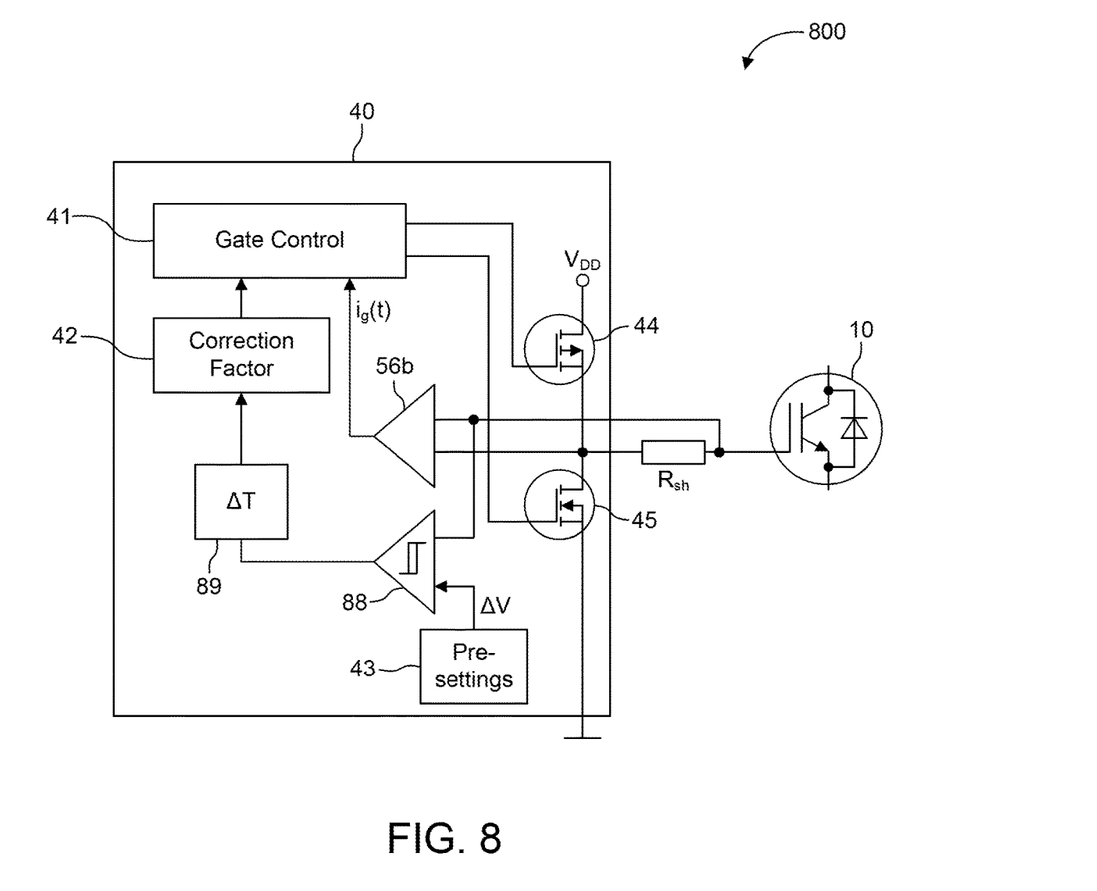
FIG. 8 shows a schematic block diagram illustrating another gate current control circuit configured to control a power transistor according to one or more embodiments.

FIG. 8 shows a schematic block diagram illustrating a gate current control circuit 800 configured to control a power transistor 10 according to one or more embodiments. The gate current control circuit 800 is similar to the gate current control circuit 500 provided in FIG. 5, except the gate current control circuit 800 includes a window detector circuit 88 and a time measurement unit 89 for determining a correction factor.

The window detector circuit 88 is configured to determine whether the gate voltage $V_{GE}$ of the power transistor 10 is between two reference threshold voltages. It may employ two comparators to detect whether $V_{GE}$ is greater than an upper threshold voltage or less than a lower threshold voltage defined by measurement window $\Delta V$ stored as a pre-setting in memory unit 43. The window detector circuit 88 may be configured to generate a low output signal (i.e., a logic "0") in either case (i.e., when $V_{GE}$ is greater than an upper threshold voltage or less than a lower threshold voltage). In contrast, the window detector circuit 88 may be configured to generate a high output signal (i.e., a logic "1") when the gate voltage $V_{GE}$ is between the two thresholds (i.e., within the measurement window $\Delta V$). The time measurement unit 89 includes processing circuitry and a counter configured to determine a time duration when the logic value output from the window detector circuit 88 is high, and outputs the time duration as $\Delta T$.

The correction factor unit 42 is configured to receive the time duration from the time measurement unit 89, and determine a time deviation from a reference value. This time deviation may then be used by the correction factor unit 42 as the correction factor, or may be used by the correction factor unit 42 to derive the correction factor (e.g., the correction factor may be proportional to the time deviation).

Figure 9:
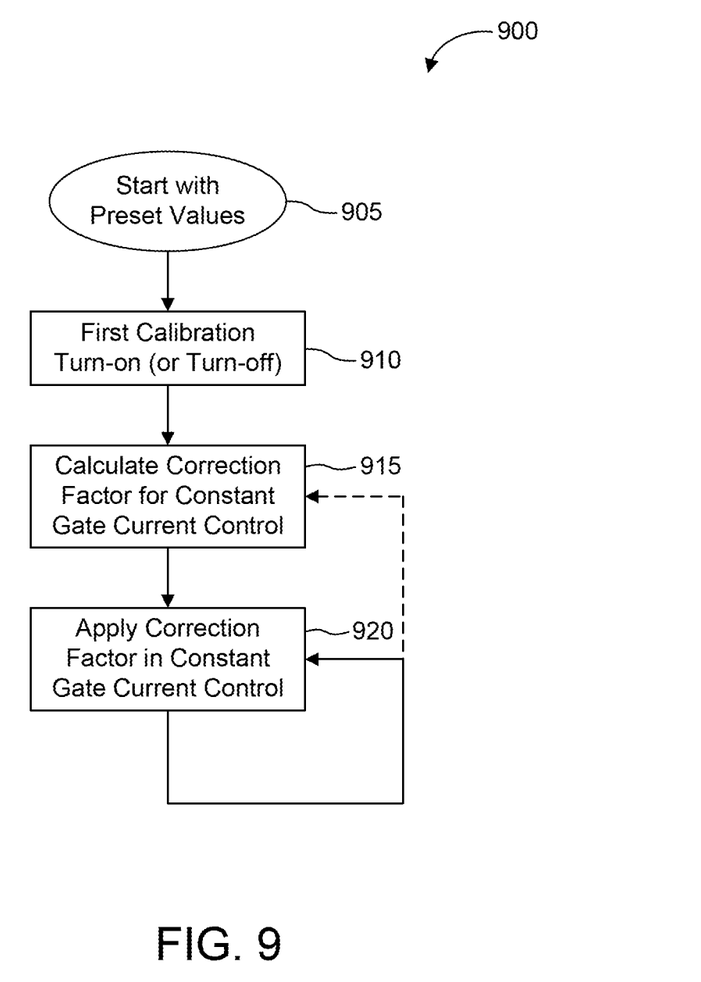
FIG. 9 shows a flow diagram of a gate current correction method according to one or more embodiments.

FIG. 9 shows a flow diagram of a gate current correction method 900 according to one or more embodiments. The method includes loading at least one preset value (e.g., $\Delta V$ and/or $\Delta T$) in memory (operation 905) and conducting a first calibration measurement at an initial turn-on (or an initial turn-off) of a power transistor (operation 910). Operation 910 includes measuring the gate voltage measurement $v_g(t)$, as in FIGS. 4-7, or the time duration, as in FIG. 8. Alternatively, operation 910 may include integrating IG over a pre-defined time-delay $\Delta T$ shorter than the initial phase.

The method 900 further includes calculating a correction factor based on the measurements taken in operation 910 (operation 915). Lastly, the method 900 includes applying the correction factor to adjust the constant current gate control implemented by a gate control unit (operation 920). Operation 920 may then be repeated for each turn-on and/or turn-off process of the power transistor. In addition, the correction factor may be recalculated, either as an occasional update based on a defined repetition rate or continuously. Thus, after applying a correction factor in operation 920, the method 900 may return to operation 910 to repeat the calculation of the correction factor to update the correction factor based on a turn-on and/or a turn-off process.

Thus, a gate controller may implement adaptive control based on a determined correction factor to control the gate current at turn-on and turn-off. By doing so, a dependency of turn-on and turn-off delay times on the input capacitance Ciss of each power transistor may be reduced such that these delay times across multiple power transistors can be normalized. Accordingly, the turn-on and the turn-off variations between power transistors may be reduced.

In addition, implementing the described switching compensation scheme provides a more predictable switching performance of power semiconductors to reach a higher usability ratio and less margins in deadtime. This may help to improve the performance of discrete power transistors and power modules, including intelligent power modules.

While various embodiments have been described, it will be apparent to those of ordinary skill in the art that many more embodiments and implementations are possible within the scope of the disclosure. For example, there may be other ways to determine the slope of $V_{GE}$. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

The techniques described in this disclosure may be implemented, at least in part, in hardware, software, firmware, or any combination thereof. For example, various aspects of the described techniques may be implemented within one or more processors, including one or more microprocessors, central processing units (CPUs), analog-to-digital converters, digital signal processors (DSPs), application specific integrated circuits (ASICs), or any other equivalent integrated or discrete logic circuitry, as well as any combinations of such components.

The terms "processor" or "processing circuitry" may be used interchangeably, and may generally refer to any of the foregoing logic circuitry, alone or in combination with other logic circuitry, or any other equivalent circuitry suitable for implementation of the techniques described herein. In addition, two or more processing units described above (e.g., the correction factor unit, the gate control unit, and the comparator circuitry) may be combined into fewer processing units and may be incorporated into a single processor. However, each processing unit may have its own corresponding sub-processor or processing circuitry.

A control unit including hardware may also perform one or more of the techniques of this disclosure, and may also be comprised of a processor or suitable processing circuitry. Such hardware, software, and firmware may be implemented within the same device or within separate devices to support the various techniques described in this disclosure.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A gate driver integrated circuit (IC) configured to drive a transistor between switching states in a power circuit, the gate driver IC comprising:
    a memory configured to store at least one measurement window parameter that defines a measurement interval;
    measurement circuitry configured to measure, over the measurement interval, a value corresponding to an operation of the power circuit, the measured value being proportional to an input capacitance of the transistor;
    processing circuitry configured to determine a correction factor based on the measured value, the correction factor being proportional to the input capacitance of the transistor; and
    a gate controller configured to control a gate current of the transistor based on the switching states and the correction factor.

2. The gate driver IC of claim 1, wherein the measured value corresponds to a slope of a gate voltage of the transistor.

3. The gate driver IC of claim 1, wherein the gate controller is configured to adjust an amplitude of the gate current based on the correction factor.

4. The gate driver IC of claim 3, wherein the gate controller is configured to adjust the amplitude of the gate current based on the correction factor such that the transistor turns off according to a predetermined turn-off delay time.

5. The gate driver IC of claim 3, wherein the gate controller is configured to adjust the amplitude of the gate current based on the correction factor such that the transistor turns on according to a predetermined turn-on delay time.

6. The gate driver IC of claim 3, wherein the gate current is at least one of a preboost-on current, a turn-on current, a preboost-off current, or a turn-off current.

7. The gate driver IC of claim 1, wherein measurement interval is a time interval, and the measured value is a change in a gate voltage of the transistor that occurs over the time interval.

8. The gate driver IC of claim 1, wherein the measurement interval is a voltage interval, and the measured value is an amount of time for a gate voltage of the transistor to change during the voltage interval.

9. The gate driver IC of claim 1, wherein the measurement interval is a time interval, and the measured value is the gate current integrated over the time interval.

10. The gate driver IC of claim 1, wherein the measurement interval is set in an initial switching phase of the transistor.

11. The gate driver IC of claim 10, wherein the initial switching phase occurs during a turn-off process of the transistor, between an initial decay of a gate voltage of the transistor and a first Miller voltage of the gate voltage of the transistor.

12. The gate driver IC of claim 10, wherein the initial switching phase occurs during a turn-off process of the transistor, where a slope of a gate voltage of the transistor is proportional to the input capacitance of the transistor.

13. The gate driver IC of claim 10, wherein the initial switching phase occurs during a turn-on process of the transistor, where a slope of a gate voltage of the transistor is proportional to the input capacitance of the transistor.

14. The gate driver IC of claim 1, wherein the processing circuitry is configured to determine the correction factor as a difference between the measured value and a reference value.

15. The gate driver IC of claim 1, wherein the processing circuitry is configured to determine the input capacitance of the transistor based on a difference between the measured value and a reference value, and determine the correction factor based on the determined input capacitance, wherein the correction factor is proportional to the determined input capacitance.

16. The gate driver IC of claim 1, wherein the gate controller is configured to receive gate current feedback information of the transistor, and to control the gate current based on the gate current feedback information and the correction factor.

17. The gate driver IC of claim 16, the gate current feedback information is a voltage drop measured across a known resistance.

18. A method of driving a transistor between switching states in a power circuit, the method comprising:
  storing at least one measurement window parameter that defines a measurement interval;
  measuring, over the measurement interval, a value corresponding to an operation of the power circuit, the measured value being proportional to an input capacitance of the transistor;
  determining a correction factor based on the measured value, the correction factor being proportional to the input capacitance of the transistor; and
  controlling a gate current of the transistor based on the switching states and the correction factor.

19. The method of claim 18, wherein the measured value corresponds to a slope of a gate voltage of the transistor.

20. The method of claim 18, wherein controlling the gate current includes adjusting an amplitude of the gate current based on the correction factor, wherein the gate current is at least one of a preboost-on current, a turn-on current, a preboost-off current, or a turn-off current.

21. The method of claim 20, wherein controlling the gate current includes adjusting the amplitude of the gate current based on the correction factor such that the transistor turns off according to a predetermined turn-off delay time.

22. The method of claim 20, wherein controlling the gate current includes adjusting the amplitude of the gate current based on the correction factor such that the transistor turns on according to a predetermined turn-on delay time.

23. The method of claim 18, further comprising:
  comparing the measured value with a lifetime predictor threshold; and
  generating a feedback signal on a condition the measured value exceeds the lifetime predictor threshold.

* * * * *